(12) United States Patent
Shizuno

(10) Patent No.: US 7,193,330 B2
(45) Date of Patent: Mar. 20, 2007

(54) SEMICONDUCTOR DEVICE WITH IMPROVED DESIGN FREEDOM OF EXTERNAL TERMINAL

(75) Inventor: Yoshinori Shizuno, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/697,247

(22) Filed: Oct. 31, 2003

(65) Prior Publication Data
US 2004/0099955 A1 May 27, 2004

(30) Foreign Application Priority Data
Nov. 8, 2002 (JP) ............... 2002-325772

(51) Int. Cl.
H01L 23/28 (2006.01)
H01L 23/52 (2006.01)
(52) U.S. Cl. ...................... 257/787; 257/783
(58) Field of Classification Search ............... 257/787, 257/783; 174/52.4
See application file for complete search history.

(56) References Cited

U.S. PATENT DOCUMENTS 6,268,648 B1    7/2001   Fukutomi et al.
6,271,469 B1 *  8/2001   Ma et al. .................... 174/52.4
6,455,920 B2 *  9/2002   Fukasawa et al. .......... 257/620
2002/0192867 A1 12/2002  Nishiyama

FOREIGN PATENT DOCUMENTS

| JP | 11-251493 | 9/1999 |
| JP | 2000-124354 | 4/2000 |
| JP | 2000208556 A | 7/2000 |
| JP | 2000-277682 | 10/2000 |
| JP | 2001-308116 | 11/2001 |
| JP | 2002-016173 | * 1/2002 |
| JP | 2002-16173 | 1/2002 |
| JP | 2002-231854 | 8/2002 |

* cited by examiner

Primary Examiner—Zandra V. Smith
Assistant Examiner—Kiesha L. Rose
(74) Attorney, Agent, or Firm—Rabin & Berdo, PC

(57) ABSTRACT

A semiconductor device comprises: a semiconductor chip; an extension portion which contacts the side surfaces of the semiconductor chip to thereby surround the semiconductor chip; an insulating film which is formed such that a part of each of the plurality of electrode pads is exposed; a plurality of wiring patterns individually electrically connected to each of the electrode pads, respectively and extended from the electrode pads to the upper side of the extension portion; and a plurality of external terminals provided over the wiring patterns in a region including the upper side of the extension portion.

8 Claims, 14 Drawing Sheets

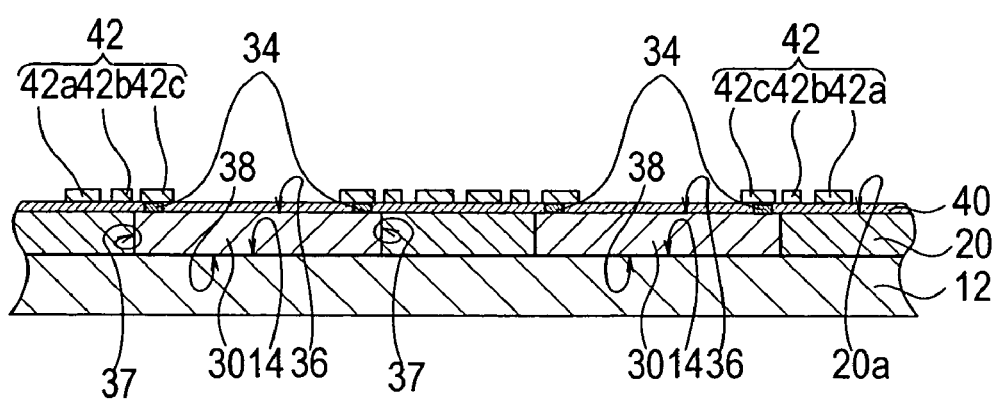

SEMICONDUCTOR DEVICE WITH IMPROVED DESIGN FREEDOM OF EXTERNAL TERMINAL

BACKGROUND OF THE INVENTION

1. Field of the Invention

This invention relates to a semiconductor device, and more particularly to a semiconductor device in which the degree of design freedom of an external terminal is increased in accordance with further increases in the number of external terminals.

2. Description of Related Art

Demands have been made in recent years for further reductions in the size and thickness of packaged semiconductor devices. In response to such demands, a packaging form known as a Wafer Level Chip Size Package (to be referred to simply as WCSP hereinafter), in which the external size of the packaging is substantially equal to the external size of the semiconductor chip, has been proposed.

A WCSP comprises a semiconductor chip. The semiconductor chip comprises a circuit element having a predetermined function and a plurality of electrode pads electrically connected to each other on the circuit element. An insulating film is formed on the surface of the semiconductor chip such that the plurality of electrode pads is exposed.

A plurality of wiring patterns connected to the exposed electrode pads is formed on the surface of the insulating film.

Electrode posts are formed on these wiring patterns. A sealing portion is then formed so as to cover the insulating film and wiring patterns and such that the top surface of the electrode posts is exposed.

A plurality of external terminals provided as solder balls used in BGA packaging, for example, is provided on the top surface of the electrode posts.

This type of WCSP has a so-called fan-in configuration in which the multiple external terminals are provided in a lattice formation, for example, in a region corresponding to a circuit-forming surface of the semiconductor chip.

As regards the mounting of the semiconductor chip comprising the external terminals in a fan-in configuration onto a printed board, Japanese Patent Application Laid-Open Publication No. 2000-208556 discloses a semiconductor device having the aim of preventing the breakage of a connecting portion between the printed board and external electrodes and comprising a semiconductor chip having electrode pads, wiring which is formed in a predetermined position on the semiconductor chip and connected to the electrode pads, external electrodes which are formed in a predetermined position on the wiring and connected to the wiring, a printed board connected to the external electrodes, and a substrate which is formed on the semiconductor chip. A resin layer is provided on the substrate for aligning the thermal expansion of the substrate and printed board, and in particular the external electrodes are provided on the resin layer.

As semiconductor devices become increasingly sophisticated, the number of external terminals formed on a single packaged semiconductor device is gradually increasing. Conventionally, such demands for increases in the number of external terminals have been met by providing constitutions in which the spacing between adjacent external terminals is narrowed. As shall be described below, however, design freedom is severely restricted by the disposal pitch and disposal positions of external terminals.

In the conventional WCSP described above, the minimum gap between adjacent external terminals is set at a concrete level of approximately 0.5 mm. In the case of a 7 mm×7 mm WCSP, the number of external terminals provided is approximately 160.

In accordance with demands for further increases in the number of external terminals on a packaged semiconductor device, it is desirable that approximately 300 external terminals be provided on a 7 mm×7 mm WCSP.

It is not technically impossible in the aforementioned WCSP to form an even larger number of external terminals on the surface of the WCSP by further narrowing the gap between adjacent external terminals.

However, it is extremely difficult to form 300 external terminals on the surface area of a 7 mm×7 mm WCSP. Moreover, if the intervals between the external terminals are narrowed, an extremely high degree of technology is required to mount the WCSP onto a mounting substrate.

For example, the intervals between the plurality of external terminals may have to be formed in alignment with the mounting pitch of the mounting substrate within a range of approximately 0.3 mm to 0.7 mm.

In a conventional packaging constitution in such a case, a semiconductor chip is connected to the substrate by means of a so-called flip chip connection and the semiconductor chip is connected to the external electrodes via the substrate. Alternatively, the substrate and semiconductor chip are connected by wire bonding and the semiconductor chip is connected to the external electrode via the substrate. Since both of these connection methods utilize a substrate, and since additional sealing material is required in accordance with the height of the wire loop, the package becomes thick. Moreover, the package becomes expensive due to the cost of the substrate. The package becomes particularly expensive when a flip chip connection is used since an expensive buildup substrate is required.

When connection is performed by means of wire bonding, the inductance of the wire part increases.

An object of this invention is therefore to provide a semiconductor device having a constitution in which design freedom in the disposal pitch and disposal positions of external terminals is increased and the package itself can be made compact.

SUMMARY OF THE INVENTION

In order to achieve this object, a semiconductor device of this invention has the following constitution. That is, the semiconductor device of this invention comprises a semiconductor chip having a first main surface on which a plurality of electrode pads is provided, a second main surface which opposes the first main surface, and one, two, or more side surfaces positioned between the first main surface and second main surface.

This semiconductor chip is surrounded by an extension portion which comprises a first surface and a second surface opposing the first surface and which is formed in contact with the side surfaces of the semiconductor chip such that the first surface is at a substantially equal level to the level of the first main surface.

An insulating film is formed on the first surface and first main surface such that each of the plurality of electrode pads, respectively is exposed.

Each of a plurality of wiring patterns is individually electrically connected to each of the electrode pads. These wiring patterns are extended from the electrode pads to the upper side of the first surface of the extension portion.

A sealing portion is formed on the insulating film on which the wiring patterns are formed such that a part of the wiring patterns is exposed.

A plurality of external terminals is provided in a region including the upper side of the extension portion so as to be electrically connected to the wiring patterns.

According to the constitution of the semiconductor device of this invention, external terminals can also be provided on the upper side of the extension portion which is provided in contact with and surrounding the semiconductor chip, and thus a semiconductor device having increased design freedom in the disposal pitch, disposal positions, and so on of the external electrodes can be provided. Further, the semiconductor device of this invention may be constructed without the use of an interposer such as a substrate by applying a so-called WCSP manufacturing process, as a result of which increases in operating speed, functional sophistication, number of functions, and compactness can be achieved in comparison with a wire bonding connection. Moreover, an identical electrical characteristic can be obtained at a lower cost than a device in which a flip chip connection is used.

The manufacturing process for implementing this invention preferably comprises the following manufacturing steps.

A manufacturing method of the semiconductor device comprises the steps of:

(1) setting a plurality of semiconductor chip disposal regions on which a plurality of semiconductor chips is to be disposed at predetermined intervals on a lower base;

(2) providing a semiconductor chip having a first main surface on which a plurality of electrode pads are provided, a second main surface which opposes the first main surface, and a plurality of side surfaces positioned between the first main surface and second main surface on the semiconductor chip disposal region such that the second main surface faces the semiconductor chip disposal region;

(3) forming an extension portion having a first surface and a second surface which opposes the first surface on the lower base so as to contact the side surfaces of the semiconductor chip and thereby surround the semiconductor chip, and such that the level of the first surface is substantially equal to the level of the first main surface;

(4) forming an insulating film on the first surface of the extension portion and the first main surface such that a part of each of the electrode pads is exposed;

(5) forming a plurality of wiring patterns on the insulating film so as to be electrically connected to each of the electrode pads, respectively and extended from the electrode pads to the upper side of the first surface of the extension portion;

(6) forming a sealing portion on the wiring patterns and insulating film such that a part of each of the wiring patterns positioned on the upper side of the first surface is exposed;

(7) forming a plurality of external terminals over the wiring patterns in a region including the upper side of the extension portion and connecting the external terminals to the wiring patterns; and (8) forming individual semiconductor devices comprising the semiconductor chip by cutting the extension portion between the plurality of semiconductor chips.

The manufacturing method of the semiconductor device also comprises the steps of:

(1) setting a plurality of semiconductor chip disposal regions on which a plurality of semiconductor chips is to be disposed at predetermined intervals on a lower base;

(2) providing a semiconductor chip having a first main surface on which a plurality of electrode pads are provided, a second main surface which opposes the first main surface, and a plurality of side surfaces positioned between the first main surface and second main surface on the semiconductor chip disposal region such that the second main surface surfaces the semiconductor chip disposal region;

(3) forming an extension portion having a first surface and a second surface which opposes the first surface on the lower base so as to contact the side surfaces of the semiconductor chip and thereby surround the semiconductor chip, and such that the level of the first surface is substantially equal to the level of the first main surface;

(4) forming an insulating film on the first surface of the extension portion and the first main surface such that a part of the electrode pads is exposed;

(5) forming a plurality of wiring patterns on the insulating film so as to be electrically connected to each of the electrode pads and extended from the electrode pads to the upper side of the first surface of the extension portion;

(6) forming a plurality of electrode posts on each of the part of the wiring patterns positioned on the upper side of the extension portion;

(7) forming a sealing portion on the wiring patterns and insulating film such that the top surface of the electrode posts is exposed;

(8) forming external terminals on the top surface of the exposed electrode posts; and (9) forming individual semiconductor devices comprising the semiconductor chip by cutting between the plurality of semiconductor chips.

The manufacturing method of the semiconductor device preferably further comprises a step of removing the lower base from the second surface of the extension portion and the second main surface following the step of forming the external terminals.

The manufacturing method of the semiconductor device further comprises the steps of:

(1) preparing a jig comprising a plurality of concave portions;

(2) disposing a semiconductor chip having a first main surface on which a plurality of electrode pads are provided, a second main surface which opposes the first main surface, and a plurality of side surfaces positioned between the first main surface and second main surface within the concave portion such that the second main surface faces the concave portion;

(3) forming an extension portion having a first surface and a second surface which opposes the first surface on the jig so as to contact the side surfaces of the semiconductor chip and thereby surround the semiconductor chip, and such that the level of the first surface is substantially equal to the level of the first main surface;

(4) forming an insulating film on the first surface of the extension portion and the first main surface such that a part of each of the electrode pads is exposed;

(5) forming a plurality of wiring patterns on the insulating film so as to be electrically connected to each of the electrode pads, respectively and extended from the electrode pads to the upper side of the first surface of the extension portion;

(6) forming a sealing portion on the wiring patterns and insulating film such that a part of each of the wiring patterns positioned on the upper side of the first surface is exposed;

(7) forming a plurality of external terminals over the wiring patterns in a region including the upper side of the extension portion and connecting the external terminals to the wiring patterns; and (8) forming individual semiconductor devices comprising the semiconductor chip by cutting between the plurality of semiconductor chips.

The manufacturing method of the semiconductor device further comprises the steps of:

(1) preparing a jig comprising a plurality of concave portions;

(2) disposing a semiconductor chip having a first main surface on which a plurality of electrode pads are provided and a plurality of side surfaces positioned between the first main surface and a second main surface within the concave portion such that the second main surface faces the concave portion;

(3) forming an extension portion having a first surface and a second surface which opposes the first surface on the jig so as to contact the side surfaces of the semiconductor chip and thereby surround the semiconductor chip, and such that a part of each of the level of the first surface is substantially equal to the level of the first main surface;

(4) forming an insulating film on the first surface of the extension portion and the first main surface such that the electrode pads are exposed;

(5) forming a plurality of wiring patterns on the insulating film so as to be electrically connected to each of the electrode pads, respectively and extended from the electrode pads to the upper side of the first surface of the extension portion;

(6) forming electrode posts which are electrically connected to each of the part of the wiring patterns positioned on the upper side of the extension portion;

(7) forming a sealing portion over the wiring patterns and insulating film such that the top surface of the electrode posts is exposed;

(8) forming external terminals on the top surface of the exposed electrode posts;

(9) removing the jig from the second surface of the extension portion and the second main surface; and

(10) forming individual semiconductor devices comprising the semiconductor chip by cutting between the plurality of semiconductor chips.

The manufacturing method of the semiconductor device preferably further comprises a step of, following the aforementioned step (2), suction-holding the semiconductor chip on a bottom surface portion of the concave portion by means of a through hole provided in the concave portion and a suction and exhaust system connected to the through hole. The step of forming the insulating film on the first surface of the extension portion and the first main surface such that a part of the electrode pads is exposed is preferably performed following this suction-holding step.

According to this manufacturing method for the semiconductor device of this invention, a semiconductor device with increased functional sophistication, number of functions, and compactness can be provided by means of a comparatively easy process. In particular, design freedom in the disposal pitch, disposal positions, and so on of the external electrodes can be greatly increased.

BRIEF DESCRIPTION OF THE DRAWINGS

The foregoings and other objects, features and advantageous of the present invention will be better understood from the following description taken in connection with the accompanying drawings, in which:

FIG. 7 is a sectional view corresponding to FIG. 6;

DESCRIPTION OF THE PREFERRED EMBODIMENTS

Figure 1A:
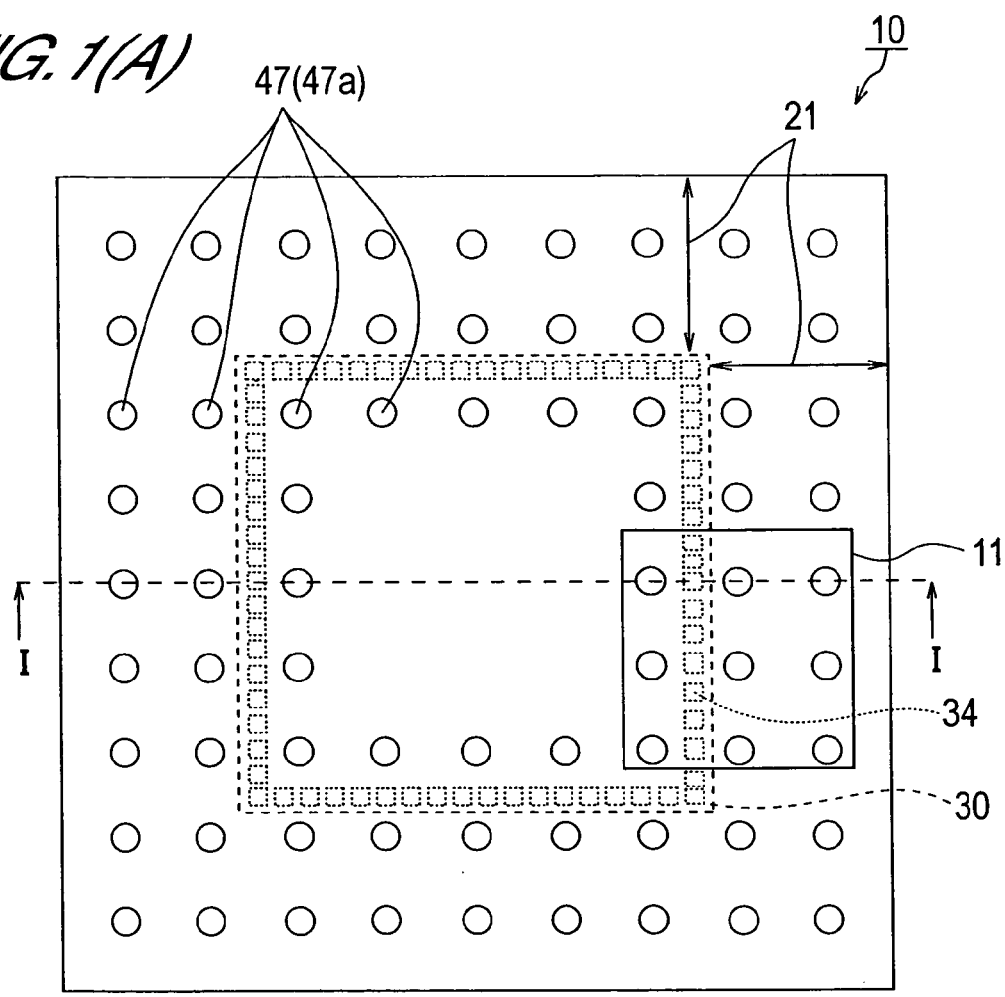
FIG. 1(A) is a plan view seen from above showing in outline the constitution of a semiconductor device of this invention.

An embodiment of this invention will be described below with reference to the drawings. Note that in the drawings, the form, magnitude, and positional relationships of each constitutional component are merely illustrated schematically in order to facilitate understanding of this invention and no particular limitations are placed on this invention thereby. Further, although specific materials, conditions, numerical value conditions, and so on are used in the following description, these are merely one preferred example thereof and therefore do not place any limitations on this invention. It is to be understood that similar constitutional components in the drawings used in the following description are allocated and illustrated with identical reference symbols, and that duplicate description thereof has occasionally been omitted.

Figure 1B:
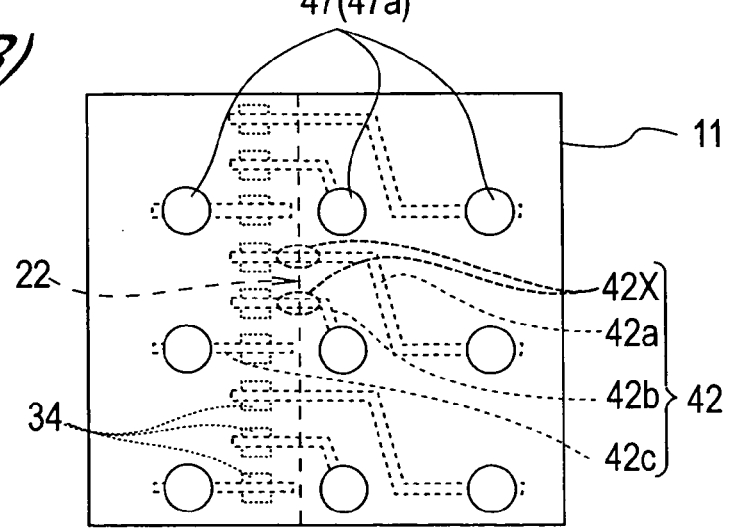
FIG. 1(B) is a plan view showing an expanded outline of the main parts of a region of FIG. 1(A) in order to illustrate the connection relationship between a wiring pattern and electrode pads.
Figure 2A:
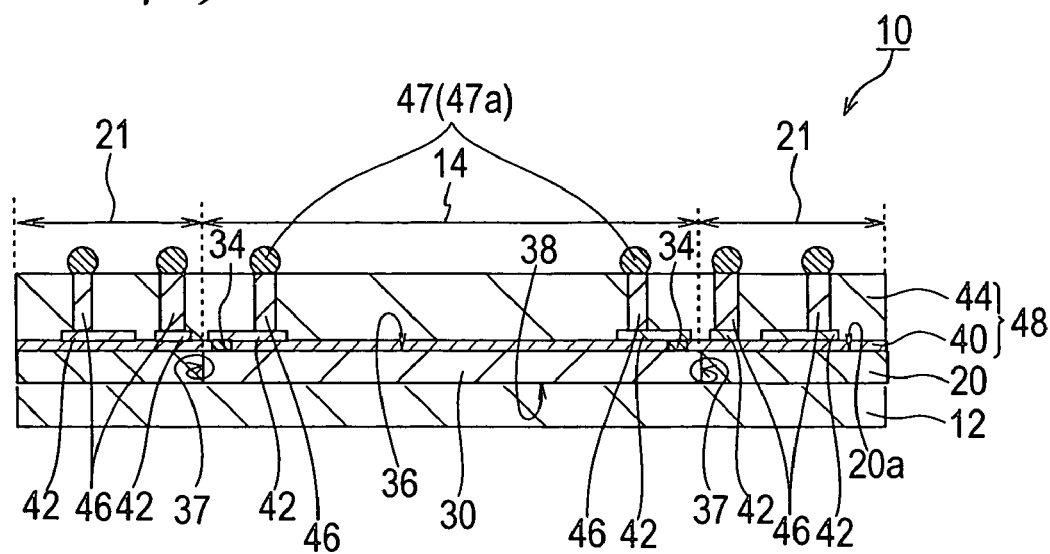
FIGS. 2(A) and 2(B) are schematic sectional views showing cross sections severed along a broken line I—I in FIG. 1(A), FIG. 2(A) showing an aspect in which a lower base is provided, and FIG. 2(B) showing an aspect in which the lower base is not provided.
Figure 2B:
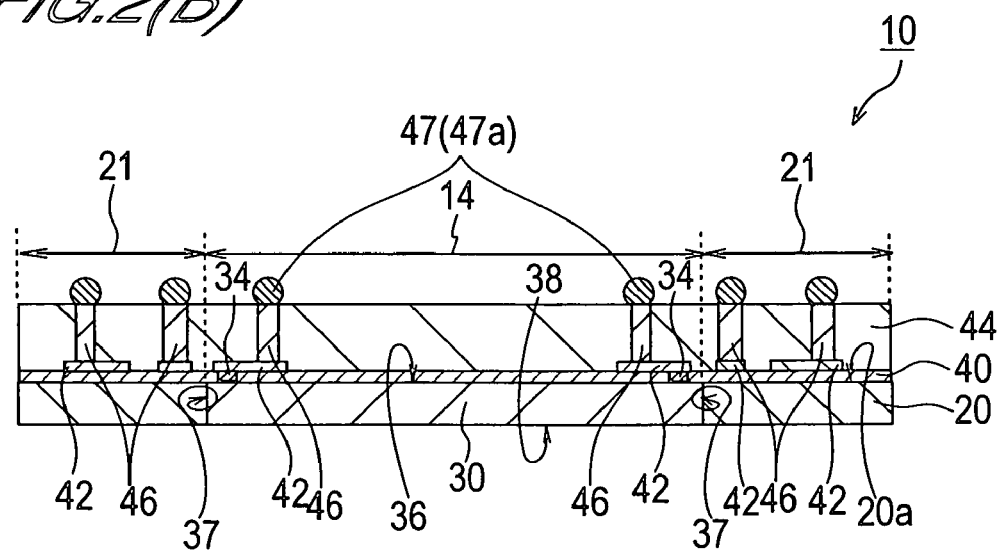

A semiconductor device according to this invention will be described with reference to FIGS. 1 and 2. FIG. 1(A) is a plan view seen from above showing in outline the constitution of a semiconductor device, and FIG. 1(B) is a plan view showing an expanded outline of the main parts of the region of FIG. 1(A) which is surrounded by a solid line 11 in order to illustrate the connection relationship between a wiring pattern and electrode posts. FIGS. 2(A) and 2(B) are schematic sectional views showing cross sections severed along a broken line I—I in FIG. 1(A). Note that FIG. 2(A) shows a constitutional example in which the semiconductor device 10 of this invention is provided with a lower base 12 on its bottom surface side. FIG. 2(B) shows a constitutional example in which the lower base 12 is not provided.

The semiconductor device 10 of this invention comprises a semiconductor chip 30 on a lower base 12. The semiconductor chip 30 comprises a first main surface 36, a second main surface 38 which opposes the first main surface 36, and one, two, or more side surfaces 37 positioned between the first main surface 36 and second main surface 38. The semiconductor chip 30 further comprises a circuit element having a predetermined function and a plurality of electrode pads 34 electrically connected to the circuit element. The plurality of electrode pads 34 is provided on the first main surface 36. The plurality of electrode pads 34 is formed around the peripheral edge of the first main surface 36.

The semiconductor chip 30 is provided on the lower base 12 such that the first main surface 36 becomes the upper surface, or in other words such that the second main surface 38 faces a semiconductor chip disposal region 14.

The semiconductor device 10 of this invention comprises an extension portion 20 on the lower base 12. The extension portion 20 is provided on the side surfaces 37 of the semiconductor chip 30 disposed in the semiconductor chip disposal region 14 on the lower base 12, or in other words contacting the surfaces of the semiconductor chip 30 other than the first and second main surfaces to thereby surround the semiconductor chip 30. This extension portion 20 is formed such that the level (i.e. height, as below) of a first surface 20a thereof is substantially equal to the level of the first main surface 36 of the semiconductor chip 30.

The extension portion 20 may be appropriately selected from an organic material such as epoxy resin or silicone resin, for example. That is, a so-called liquid resin or mold resin may be applied.

In order to prevent warping of the semiconductor device 10 of this invention during the manufacturing process, the extension portion 20 is preferably formed from a material having a larger molding shrinkage than the molding shrinkage of a subsequently formed sealing portion.

Here, "molding shrinkage" indicates shrinkage of a single material occurring during a molding process. In other words, "molding shrinkage" corresponds to the sum of curing shrinkage at molding temperature and thermal contraction occurring during the return from molding temperature to normal temperature.

More specifically, the extension portion 20 is preferably formed from a liquid resin having a coefficient of linear expansion within a lower temperature range than glass transition point of less than $1.5 \times 10^{-5}/°$ C. and a modulus of elasticity within a range of 7.8 to 22 GPa. A case in which mold resin is applied to the extension portion 20 will be described hereinafter.

An insulating film 40 is formed on the first surface 20a of the extension portion 20 and the first main surface 36 such that a part of each of the plurality of electrode pads 34 is exposed.

A plurality of wiring patterns 42 is formed on the surface of the insulating film 40 so as to be electrically connected to the exposed electrode pads 34, respectively.

A sealing portion 44 is provided on the respective surface regions of the semiconductor chip 30 and extension portion 20 so as to cover the wiring patterns 42 and insulating film 40. The insulating film 40 and sealing portion 44 described above are also referred to collectively as an insulating layer 48. Electrode posts 46 are provided so as to pass from each of the wiring patterns 42 through the sealing portion 44 to reach the surface of the sealing portion 44. Apart of the electrode posts 46 is provided on the upper side of (directly above) the semiconductor chip 30, and the remaining electrode posts 46 are provided on the upper side of (directly above) the extension portion 20. These electrode posts 46 are normally arranged at a constant pitch. The top surface of each electrode post 46 is exposed on the surface of the sealing portion 44. The electrode posts 46 are also referred to as post electrodes, and external terminals 47 are provided on the exposed top surface thereof. Solder balls 47a are usually provided as the external terminals 47. These external terminals 47 are provided at a wider pitch than the arrangement pitch of the electrode pads 34.

Here, using FIG. 1(B), the connection relationships between the electrode pads 34 and wiring patterns 42 will be described. A partial region (the region surrounded by the solid line) 11 of FIG. 1(A) has been expanded and illustrated in order to facilitate understanding of these connection relationships. The wiring patterns 42 are constituted such that each of the electrode posts (shown as 46 in FIG. 2) connected to the lower portion of the external terminals 47 is regularly and electrically connected to a corresponding electrode pad 34. A long wire 42a, a medium wire 42b, and a short wire 42c, for example, are provided as the wires which constitute each wiring pattern 42. These wires 42a, 42b, and 42c are respectively connected in that order to the corresponding electrode pad 34 in a one-on-one connection relationship of one wire to one electrode pad.

The wiring patterns 42 are provided in a region on the upper side of (directly above) the semiconductor chip 30 and on the upper side of (directly above) the extension portion 20, or in other words so as to straddle the boundary of an extended region 21. More specifically, at least a part of the plurality of wiring patterns 42 is individually electrically connected to each of the electrode pads 34 such that the electrode pads 34 are extended from the upper side of the first main surface to the upper side of the first surface 20a of the extension portion 20 discretely insulated from one another.

Hence the portions 42X of the wiring patterns 42 having a certain length on or in the vicinity of this boundary is preferably comprised of thicker and/or wider wire.

In other words, portions of the wiring patterns on a boundary and vicinity thereof between semiconductor chip and the extension portion are formed wider or more thickly than other portions of said wiring patterns.

By forming the partial region 42X of the wiring patterns 42 at which stress is considered more likely, due to such phenomena as thermal stress and particularly an edge effect, to be thicker in this manner, operational reliability in the semiconductor device 10 is improved.

The region on the upper side of (directly above) the extension portion 20 is referred to as the extended region 21 due to the fact that the external terminal forming region extends beyond the surface region of the semiconductor element. In this constitutional example, electrode posts 46 are also formed on the extended region 21.

The sealing portion 44 is formed so as to cover the wiring patterns 42 and electrode posts 46. The sealing portion 44 is formed such that a part of each of the electrode posts 46 is exposed.

The external terminals 47 are formed via the electrode posts 46. A constitution is also possible in which the external terminals are directly connected to the wiring patterns 42 without passing through the electrode posts by exposing a part of the wiring patterns 42 through the sealing portion 44.

In this constitutional example, the external terminals 47 are formed from solder balls 47a, for example. These solder balls 47a are provided on the top surface of the exposed electrode posts 46 and connected to the wiring patterns 42 via the electrode posts 46. The arrangement and pitch of adjacent electrode posts 46 may be set as desired in consideration of mounting onto a printed board or the like, for example.

As described above, the electrode posts 46 are provided not only within a surface area range corresponding to the upper side of the semiconductor chip 30, but also on the upper side of the extension portion 20, or in other words on the extended region 21. As a result, design freedom in the disposal positions and disposal pitch of the electrode posts 46 is increased. In other words, restrictions on the disposal pitch of the external terminals 47 are eased such that mounting is facilitated, and thus the electrode posts 46 can be formed at wider intervals and in a desired number in accordance with the constitutional requirements on the mounting substrate side, for example. More specifically, external terminals can be formed at a desired disposal pitch and in a desired number by appropriately adjusting the surface area of the formed extension portion 20.

By removing the lower base 12 as desired by peeling the lower base 12 away in a manufacturing process to be described below, a thinner semiconductor device 10 such as that shown in FIG. 2(B) can be obtained.

According to the constitution of the semiconductor device 10 of this invention, the external terminals 47 are provided on the side surfaces 37 of the semiconductor chip 30, or in other words on the upper side of (directly above) the extension portion 20, that is the extended region 21, which is provided in contact with and so as to surround the surfaces of the semiconductor chip 30 other than the first main surface 36 and second main surface 38. Thus the semiconductor device 10 can be constituted in a so-called fan-out constitution or a fan-in/fan-out constitution in which the external terminals 47 are also formed on the upper side of the first main surface 36. As a result, design freedom in the disposal pitch, disposal positions, and so on of the external terminals 47 can be increased.

The semiconductor device 10 of this invention is constituted using a so-called WCSP manufacturing process such that the semiconductor chip 30 and external terminals 47 are directly connected without the use of an interposer such as a substrate, and thus in addition to the aforementioned effect, the operational speed, functional sophistication, number of functions, and compactness of the semiconductor device 10 can be increased in comparison with a device in which a wire bonding connection, for example, is used. The semiconductor device 10 can also be obtained with an identical electrical characteristic to and at a lower cost than a device in which a flip chip connection, for example, is used.

Next, a first manufacturing method for the semiconductor device of the first embodiment will be described with reference to FIGS. 3(A) to 10(B).

As a rule, each FIG. (A) is a partial schematic plan view seen from above for illustrating the constitution of the semiconductor device of this invention, and each FIG. (B) is a schematic sectional view showing a cross section severed along a broken line I—I of the corresponding FIG. (A). To facilitate description, FIG. 6(B) is an exception to this rule, being a partial enlarged view of the part of FIG. 6(A) which is surrounded by a solid line 11. Moreover, FIG. 7 is a schematic sectional view severed along the I—I line of FIG. 6(A).

First, a semiconductor chip disposal region 14 on which the semiconductor chip 30 is to be placed is set on the prepared lower base 12. The profile of the semiconductor chip disposal region 14 substantially matches the profile of the semiconductor chip 30. The intervals between adjacent semiconductor chip disposal regions 14 are set to be equal. This interval is preferably set to a sufficient value in consideration of the surface area of the margin required when the semiconductor devices are divided into individual units in a subsequent process, the surface area of the surface region of the extension portion which is formed in accordance with the desired number of external terminals, and so on.

Figure 3A:
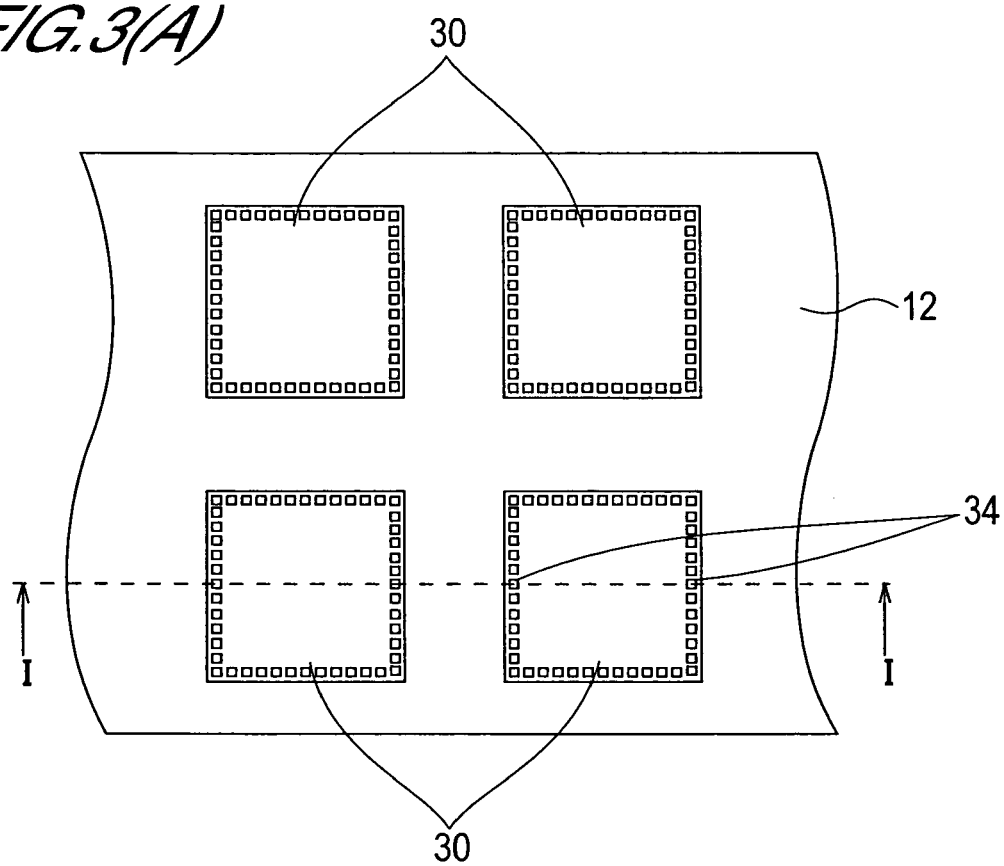
FIGS. 3(A) and 3(B) are a schematic plan view seen from above and a sectional view for illustrating a first manufacturing method for the semiconductor device of this invention.
Figure 3B:
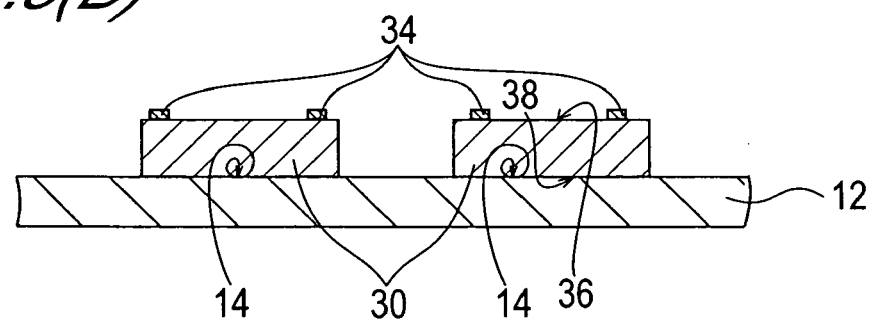

First, as shown in FIGS. 3(A) and (B), position alignment between the set semiconductor chip disposal region 14 and the lower base 12 is performed, whereupon the semiconductor chip 30 is disposed on the lower base 12.

As described above, the semiconductor chip 30 comprises a first main surface 36. The first main surface 36 is provided with the electrode pads 34. The electrode pads 34 are provided in a plurality around the peripheral edge of the semiconductor chip 30. The semiconductor chip 30 also comprises the second main surface 38 which opposes the first mains surface 36 and one, two, or more side surfaces 37 positioned between the first main surface and second main surface.

Here, the lower base 12 may be formed from a plate-form or sheet-form body made of an organic material such as a glass epoxy or a polyimide, for example. Alternatively, the lower base 12 may be appropriately selected as desired from a ceramic substrate, a metallic substrate, an Si substrate, or similar. The surface of the lower base 12, or at least the region on which the semiconductor chip 30 is disposed, is preferably constituted by a member which is constituted by adhesion means (not shown) such as an adhesive.

The semiconductor chip 30 is preferably held on the semiconductor chip disposal region 14 by adhesion using the adhesion means.

Particularly if the semiconductor device of this invention is to be formed without a lower base as shown in FIG. 2(B), a lower base which can be easily removed in a subsequent step using a method such as peeling, for example, should be selected. Specifically, a thermal release sheet "Revalpha" (product name), manufactured by Nitto Denko Corporation, heat-resistant "Icros Tape" (product name) or the "SP Series" (product name), manufactured by Mitsui Chemicals Inc., or similar may be applied as a lower base which can be peeled away at a later stage. A glass substrate or the like on whose surface an ultraviolet curable adhesive, for example, is painted to serve as adhesion means may also be favorably applied.

Figure 4A:
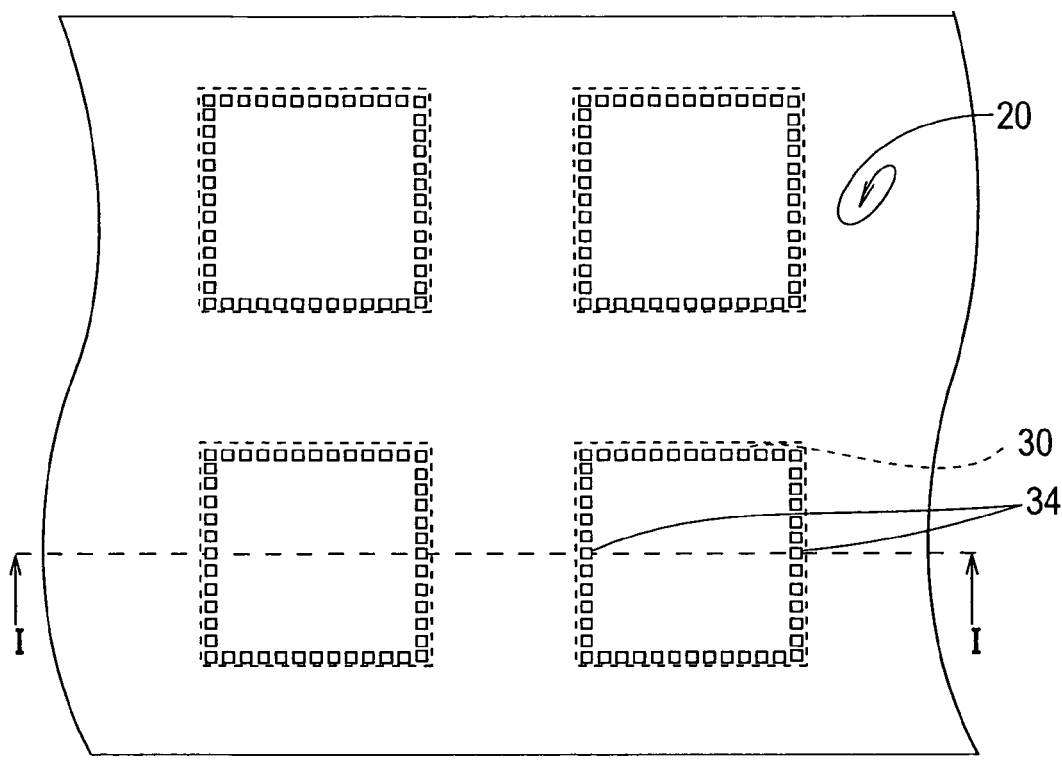
FIGS. 4(A) and 4(B) are a schematic plan view seen from above and a sectional view proceeding from FIG. 3 for illustrating the first manufacturing method for the semiconductor device of this invention.
Figure 4B:
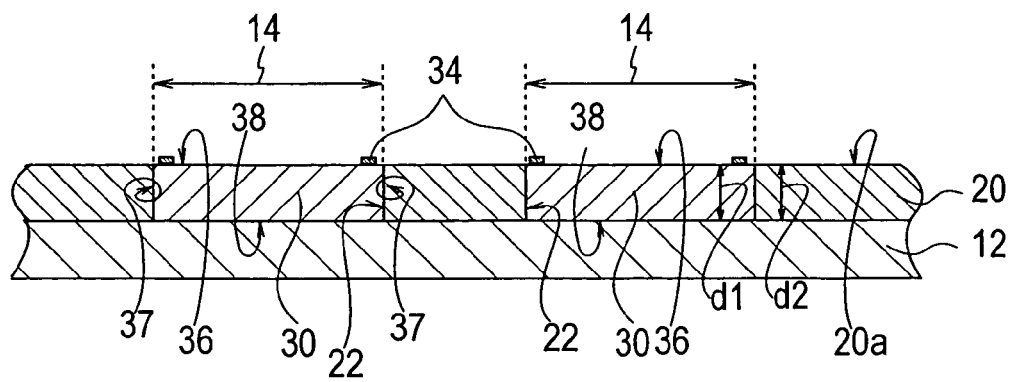

Next, as shown in FIGS. 4(A) and (B), the extension portion 20 is formed on the side surfaces 37 of the semiconductor chip 30, or in other words in contact with and surrounding the surfaces of the semiconductor chip 30 other than the first and second main surfaces 36 and 38, so as to fill the gaps between the plurality of semiconductor chips 30.

As described above, the extension portion 20 may be applied using a so-called liquid resin or mold resin as the material therefor. This material may be appropriately selected from an organic material such as epoxy resin or silicone resin, for example.

In order to prevent warping of the semiconductor device 10 during the manufacturing process, the extension portion 20 is preferably formed from a material having a larger molding shrinkage than the molding shrinkage of a subsequently formed sealing portion. More specifically, the extension portion 20 is preferably formed using as a material a liquid resin having a coefficient of linear expansion at a lower temperature than the glass transition temperature of less than $1.5 \times 10^{-5}/°$ C. and a modulus of elasticity within a range of 7.8 to 22 GPa.

The following methods, for example, may be applied to the formation of the extension portion 20. (1) and (2) are methods employed when a liquid resin is applied to the extension portion 20, and (3) is a method employed when a mold resin is applied to the extension portion 20.

(1) Liquid resin is supplied by a dispensing method so as to fill the gaps between the plurality of semiconductor chips 30, whereupon the liquid resin is cured using appropriate curing means.

(2) Liquid resin is supplied by a precision printing method so as to fill the gaps between the plurality of semiconductor chips 30, whereupon the liquid resin is cured using appropriate curing means.

(3) The first main surface 36 of the semiconductor chip 30 is set in a die so as to be protected and mold resin is supplied by a transfer mold method so as to fill the gaps between the plurality of semiconductor chips 30. The mold resin is then cured using appropriate curing means.

Here, the height of the first surface 20a of the extension portion 20, that is a thickness d2, and the height of the first main surface 36 of the semiconductor chip 30, that is a thickness d1, preferably match. However, a slight height difference, undulation, or the like may exist as long as this difference is within the range of a difference of elevation at which the subsequently formed wiring patterns may be formed without the danger of the wires becoming disconnected or the like.

Dimensional accuracy in the direction of thickness may be improved particularly when mold resin is applied to the extension portion 20, as a result of which the extension portion 20 may be formed with a higher degree of precision.

Next, the insulating film 40 is formed on the surface of the extension portion 20 and the first main surface 36. The insulating film 40 is formed such that the electrode pads 34 on the semiconductor chip 30 are at least partially exposed.

Here, a process may be used in which the insulating film 40 is formed to cover the electrode pads 34, whereupon the electrode pads 34 are exposed using a photolithography method or the like, for example.

As described above, a height difference may sometimes occur between the surface of the extension portion 20 and the surface of the semiconductor chip 30. An undulation or depression may also sometimes occur on the surface of the extension portion 20. In such cases, the insulating material for the insulating film 40 may be used to reduce this height difference such that wiring patterns can be formed in a subsequent step or to make the insulating film 40 substantially even.

Formation of the insulating film 40 maybe performed using an appropriate insulating material and by means of a method which is suited to the material of the extension portion 20, for example a well-known method such as spin coating, printing, or direct application.

Next, as shown in FIGS. 6 and 7, a plurality of wiring patterns 42 is formed on the surface of the insulating film 40. Formation of these wiring patterns 42 is performed following setting such that each wiring pattern 42 is electrically connected to a corresponding electrode pad 34 on the surface of the insulating film 40 and in consideration of the disposal of the external terminals to be formed at a later stage.

More specifically, the wire width, wire spacing, optimum angles, and so on are determined in accordance with applicable wiring process rules such that connections can be made at the shortest possible distances. As shown in the drawings, for example, a plurality of wiring pattern groups, each comprising a long wire 42a, a medium wire 42b, and a short wire 42c, is formed in respect of the plurality of electrode pads 34 formed around the peripheral edge of the semiconductor chip 30 at the shortest possible distances, and one end portion of each wire is connected to the corresponding electrode pad 34. An electrode post mounting pad is formed on the other end portion so that an external terminal 47 (solder ball 47a) can be connected thereto via an electrode post. In other words, each of the plurality of wiring patterns 42 is individually electrically connected to each of the electrode pads 34 on the insulating film 40 such that the electrode pads 34 are extended from the upper side of the first main surface 36 to the upper side of the first surface 20a of the extension portion 20.

Figure 5A:
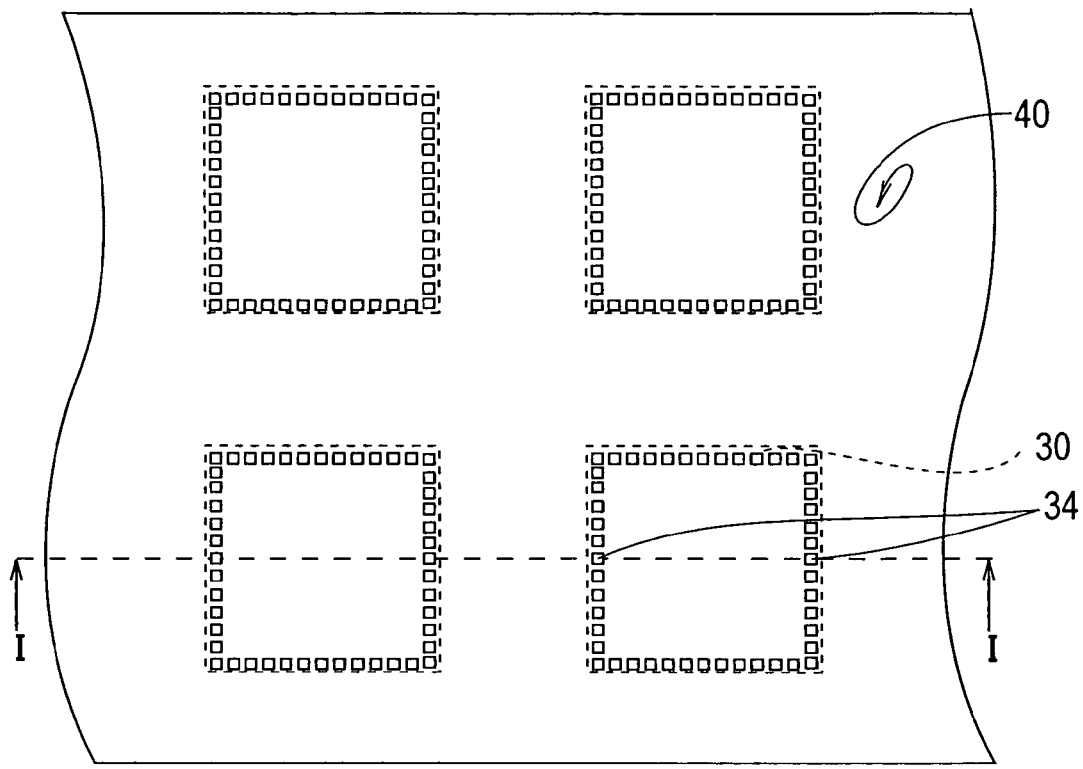
FIGS. 5(A) and 5(B) are a schematic plan view seen from above and a sectional view proceeding from FIG. 4 for illustrating the first manufacturing method for the semiconductor device of this invention.
Figure 5B:
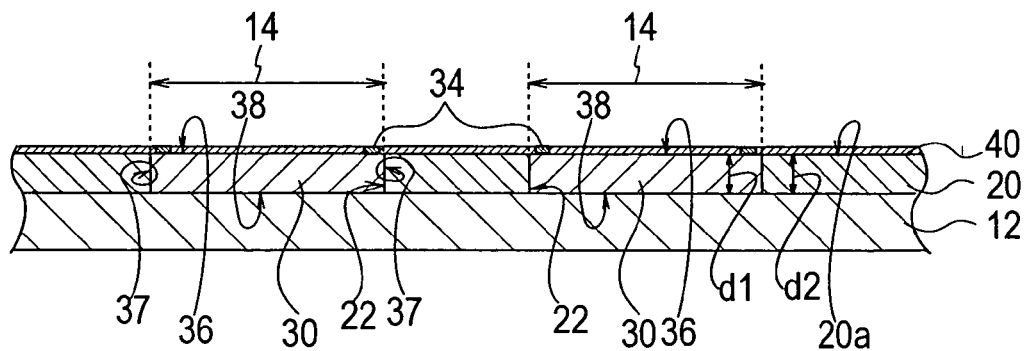
Figure 6A:
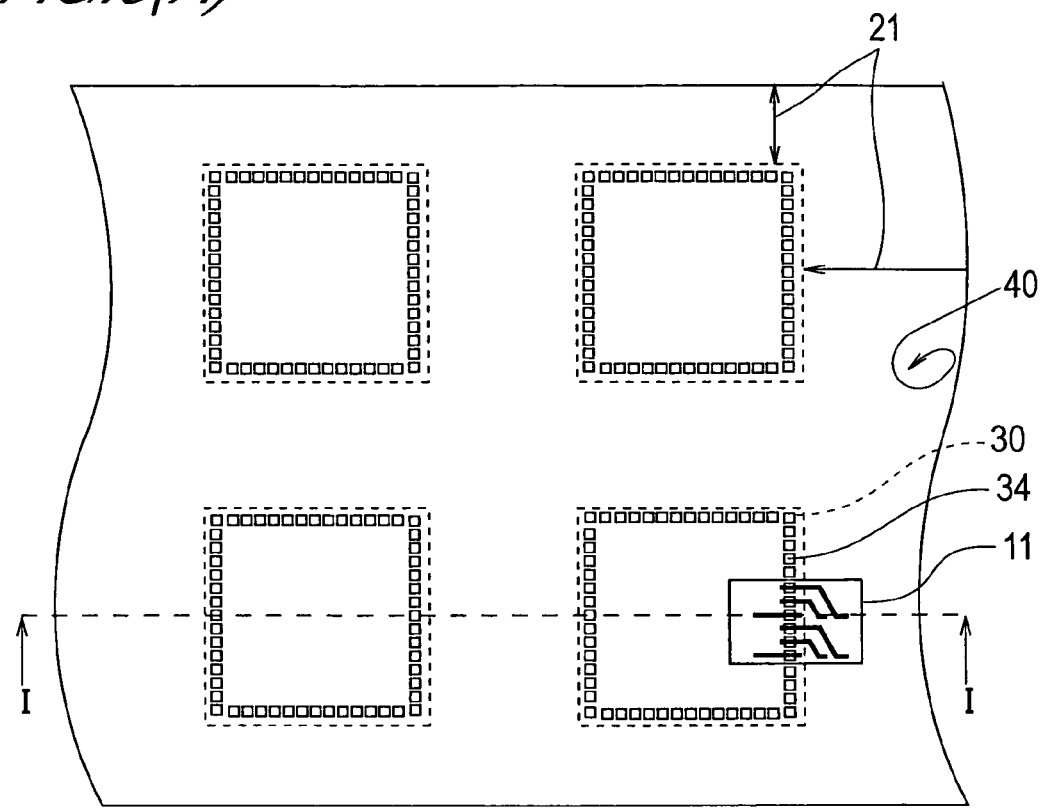
FIG. 6(A) is a schematic plan view seen from above for illustrating the first manufacturing method for the semiconductor device of this invention.
Figure 6B:
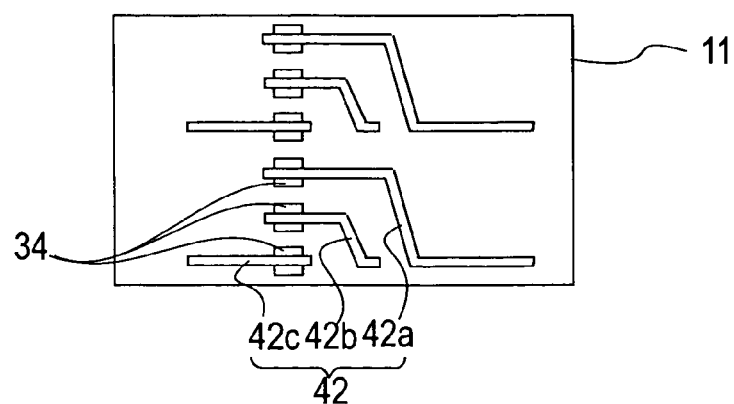
FIG. 6(B) is a sectional view severed along a broken line I—I in FIG. 6(A)

Note that to facilitate description, the disposed electrode pads 34 in FIGS. 5(A) and 6(A) are illustrated schematically in a smaller number than the actual number.

The wiring patterns 42 may be formed by performing a wiring pattern formation process in a well-known WCSP manufacturing process such as sputtering or photolithography on the upper side of the extension portion 20 on the surface region of the insulating film 40, or in other words a desired region on the insulating film 40 including the extended region 21. The material used to form the wiring patterns 42 may be selected appropriately at will, but is preferably a material such as aluminum, copper, or a metal alloy. The wiring patterns 42 may be formed by selecting an appropriate material such as copper, for example.

Figure 8A:
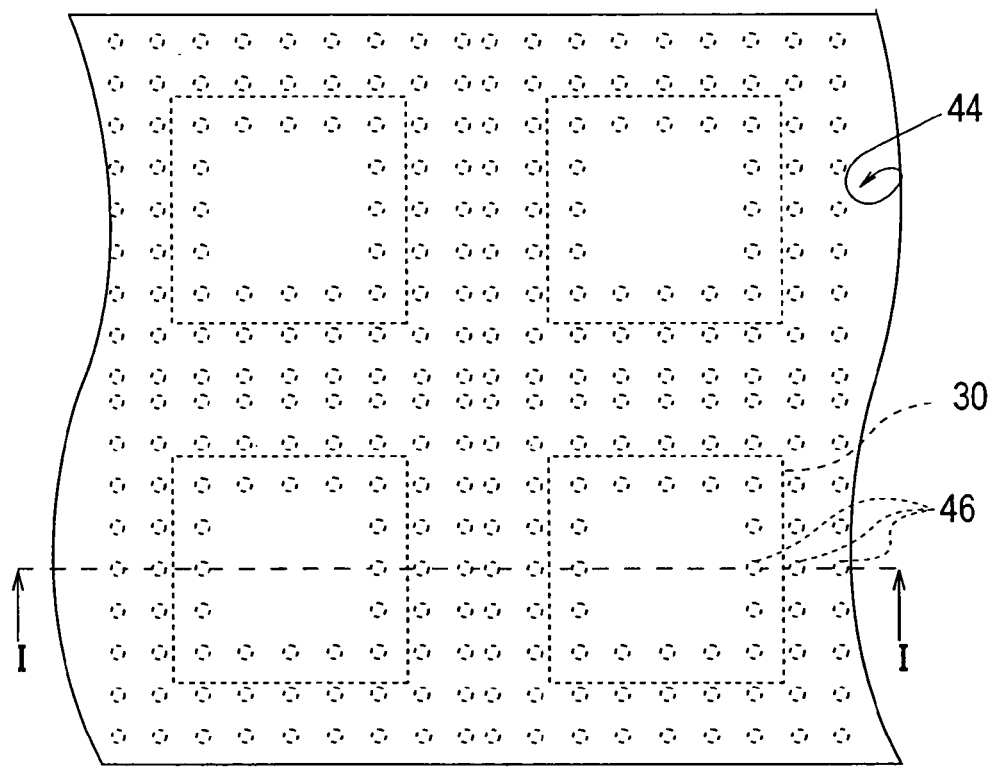
FIGS. 8(A) and 8(B) are a schematic plan view seen from above and a sectional view proceeding from FIGS. 6 and 7 for illustrating the first manufacturing method for the semiconductor device of this invention.
Figure 8B:
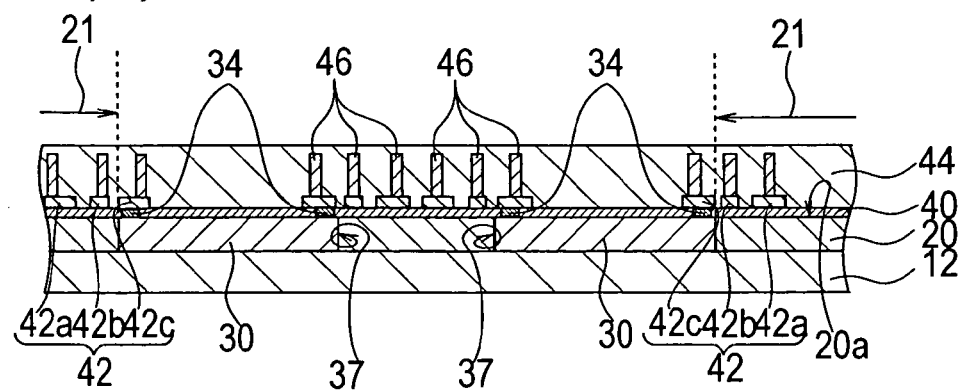

Next, as shown in FIGS. 8(A) and 8(B), the electrode posts 46 are formed on the surface of each wiring pattern 42 so as to be electrically connected thereto. The electrode posts 46 are provided in the extended region 21 on the upper side of (directly above) the extension portion 20 and in the region near the extended region 21 on the upper side of (directly above) the semiconductor chip 30. The electrode posts 46 are formed in a lattice formation and arranged at predetermined intervals. As described above, these intervals may be set in consideration of mounting, or in other words as either constant or irregular intervals.

After an appropriate material has been selected, the electrode posts 46 may be formed by means of an electrode post 46 forming process in a well-known WCSP manufacturing process such as plating or photolithography.

The sealing portion 44 is formed so as to cover the surface of the insulating film 40 on which the wiring patterns 42 and electrode posts 46 are formed. The sealing portion 44 is formed such that a part of the extended parts of the wiring patterns 42 (or the wiring patterns 42 themselves when electrode posts are not formed) is exposed.

This sealing process may be implemented by means of a well-known method using a well-known sealing material such as an epoxy mold resin.

A mold resin generally used here has the following property values, for example: a linear expansion coefficient at a lower temperature than glass transition temperature within a range of 0.6 to $1.3 \times 10^{-5}/°$ C.; a glass transition temperature (Tg) within a range of 125 to 220° C.; and a modulus of elasticity within a range of 9.8 to 24 GPa (1000 to 2450 kg/mm$^2$). These values may be favorably applied to the semiconductor device 10 of this invention.

As described above, and particularly when the extension portion 20 is formed from a so-called mold resin similarly to the sealing portion 44, the material is determined such that the molding shrinkage of the mold resin used to form the extension portion 20 is larger than that of the sealing portion 44 in order to prevent warping of the semiconductor device 10 during the manufacturing process. The following combinations can be cited as examples of the properties of the mold resin used for the extension portion 20 and sealing portion 44.

(1) Extension portion/sealing portion: the properties of the extension portion mold resin are a linear expansion coefficient at a lower temperature than glass transition temperature within a range of 1.1 to $1.5 \times 10^{-5}/°$ C. and a glass transition temperature (Tg) which is larger than 170° C.; the properties of the sealing portion mold resin are a linear expansion coefficient at a lower temperature than glass transition temperature of less than $1.0 \times 10^{-5}/°$ C., a glass transition temperature (Tg) within a range of 125 to 220° C., and a modulus of elasticity within a range of 14.7 to 24 GPa (1500 to 2450 kg/mm$^2$).

(2) Extension portion/sealing portion: the properties of the extension portion mold resin are a linear expansion coefficient at a lower temperature than glass transition temperature within a range of 1.1 to $1.7 \times 10^{-5}/°$ C., a glass transition temperature (Tg) which is lower than 170° C., and a modulus of elasticity within a range of 9.8 to 19.6 GPa (1000 to 2000 kg/mm$^2$); the properties of the sealing portion mold resin are a linear expansion coefficient at a lower temperature than glass transition temperature of less than $1.0 \times 10^{-5}/°$ C., a glass transition temperature (Tg) within a range of 125 to 220° C., and a modulus of elasticity within a range of 14.7 to 24 GPa (1500 to 2450 kg/mm$^2$).

(3) Extension portion/sealing portion: the properties of the extension portion mold resin are a linear expansion coefficient at a lower temperature than glass transition temperature within a range of 1.1 to $1.7 \times 10^{-5}/°$ C., a modulus of elasticity of 13.7 GPa (1400 kg/mm$^2$), and a glass transition temperature (Tg) within a range of 125 to 170° C.; the properties of the sealing portion mold resin are a linear expansion coefficient at a lower temperature than glass transition temperature of less than $1.0 \times 10^{-5}/°$ C., a glass transition temperature (Tg) within a range of 125 to 220° C., and a modulus of elasticity within a range of 14.7 to 24 GPa (1500 to 2450 kg/mm$^2$).

Figure 9A:
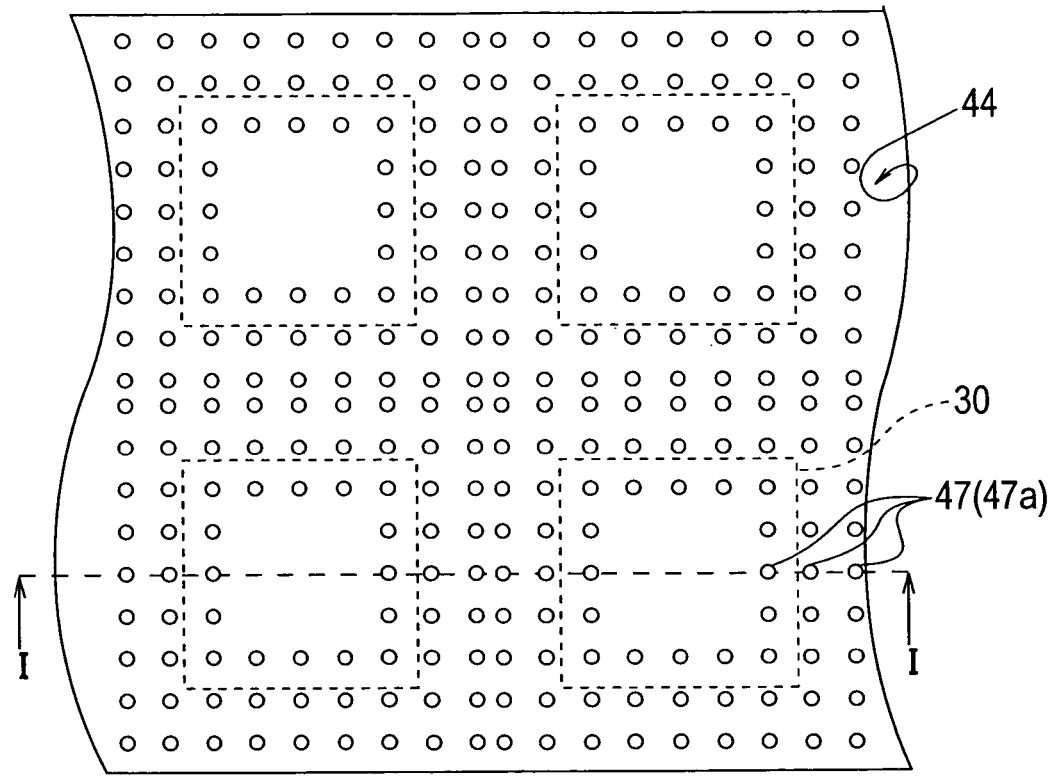
FIGS. 9(A) and 9(B) are a schematic plan view seen from above and a sectional view proceeding from FIG. 8 for illustrating the first manufacturing method for the semiconductor device of this invention.
Figure 9B:
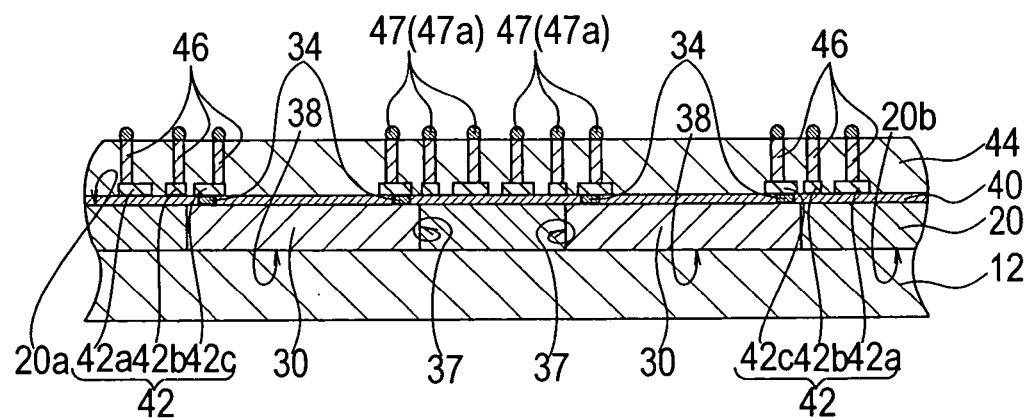

Next, as shown in FIGS. 9(A) and 9(B), the surface side of the sealing portion 44 is trimmed such that the top surface (also referred to as the upper surface) of the electrode posts 46 is trimmed and exposed.

This process may be performed using a well-known grinding or polishing process.

A method such as film formation may also be applied to the formation of the sealing portion 44. In this case, substantially no load is placed on the electrode posts 46. Also in this case, the sealing portion 44 can be formed such that the top surface of the electrode posts 46 is directly exposed on the surface of the sealing portion 44 without the need for a grinding process on the sealing portion 44 as described above.

At this time, any suitable processing required from a design point of view may be performed on the exposed top surface of the electrode posts 46. If copper is used as the material for the electrode posts 46, for example, an Ni (nickel) film or the like may be formed on the top surface of the electrode posts 46 as a barrier metal layer.

The plurality of external terminals 47 is formed on the wiring patterns 42 in the region including the upper side of the extension portion 20 to be individually electrically connected to the extended part of the wiring patterns 42, or in other words the exposed part thereof.

In this constitutional example, solder balls 47a, for example, are formed as the external terminals 47 on the upper surface of the electrode posts 46 which is exposed through the surface of the sealing portion 44.

Figure 10A:
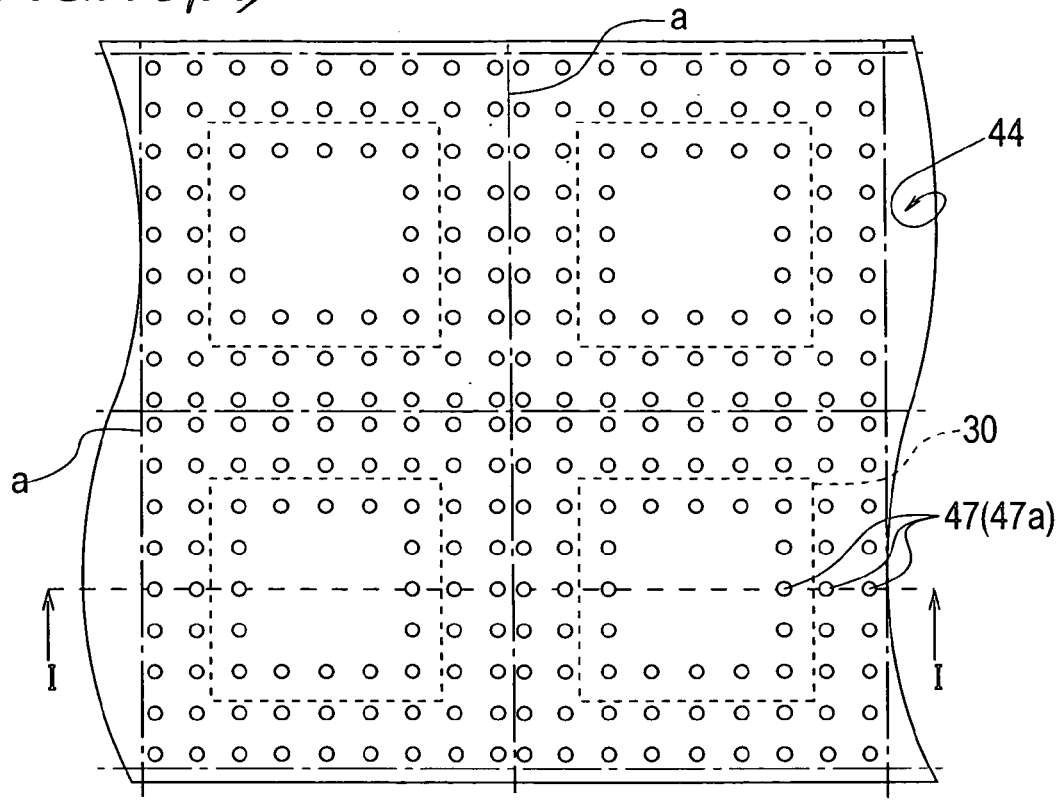
FIGS. 10(A) and 10 (B) are a schematic plan view seen from above and a sectional view proceeding from FIG. 9 for illustrating the first manufacturing method for the semiconductor device of this invention.
Figure 10B:
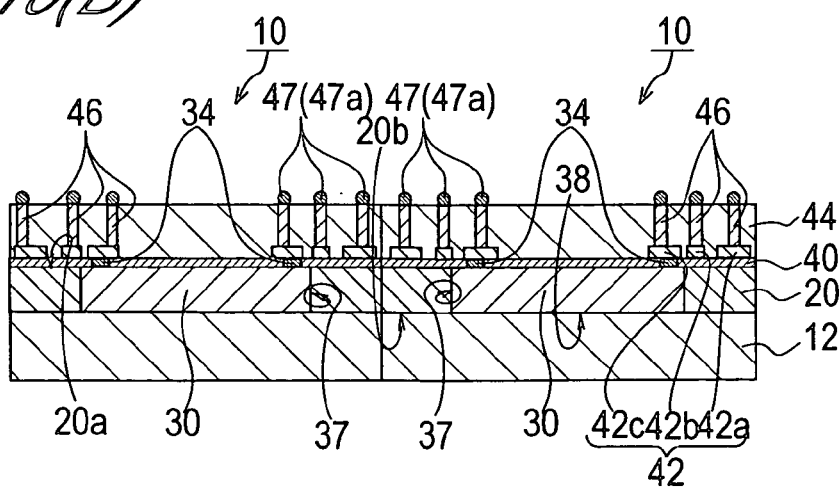

Next, as shown in FIGS. 10(A) and 10(B), the extension portions 20 and sealing portion 44 between the plurality of semiconductor chips 30 are severed along a cutting line shown in the drawings by a dot/dash line a to provide individual constitutional bodies comprising a single semiconductor device having a predetermined function.

This singularization process is preferably performed using a blade or the like which rotates at high-speed, for example.

Next, as desired, the lower base 12 is removed from the second surface 20b of the extension portion 20 and the second main surface 38 of each divided constitutional body by being peeled away therefrom.

When the lower base 12 is constituted by peelable adhesion means such as those described above or peelable adhesion means are provided on the lower base 12 in the manufacturing process, the lower base 12 should be peeled away using processing corresponding to the adhesion means such as heating, processing using heated water, or ultraviolet radiation. More specifically, when a thermal release sheet is applied as the lower base 12, for example, the lower base 12 may be peeled away by heating the adhesion means to a predetermined temperature. If ultraviolet curable adhesive is applied as the adhesion means, for example, the lower base 12 may be removed by curing the adhesive using ultraviolet radiation.

This peeling process may be executed either following the electrode post 46 forming step, the sealing step, or the singularization step. Considering the mechanical strength and soon of the extension portion 20, however, peeling is preferably performed at the end of the sealing step.

In the description of the manufacturing method for the semiconductor device of this invention, an example was illustrated in each of the drawings in which a plurality of semiconductor devices 10 is manufactured simultaneously by disposing a plurality of semiconductor chips in a 2 (vertical)×X (horizontal, X being a positive number of no less than 2) lattice formation on the lower base or jig. However, this invention is not limited thereto, and semiconductor devices may be manufactured simultaneously by arranging a larger number of semiconductor chips in a larger lattice formation.

Since a WCSP manufacturing process can be applied to the first manufacturing method, the semiconductor device 10 can be manufactured without the need for any special manufacturing processes for the semiconductor device 10.

Next, a second manufacturing method for the semiconductor device of this invention will be described with reference to FIGS. 11(A) through 14(C). Note that in the following manufacturing processes, the applied materials, process implementation conditions, and so on are similar to those in the first method and hence detailed description thereof has been omitted.

The second manufacturing method differs in that the jig 50 is used to implement each process in place of the lower base 12 described in the first manufacturing method.

First the constitution of a preferred jig to be applied to the second manufacturing method will be described with reference to FIGS. 11 and 12.

Figure 11A:
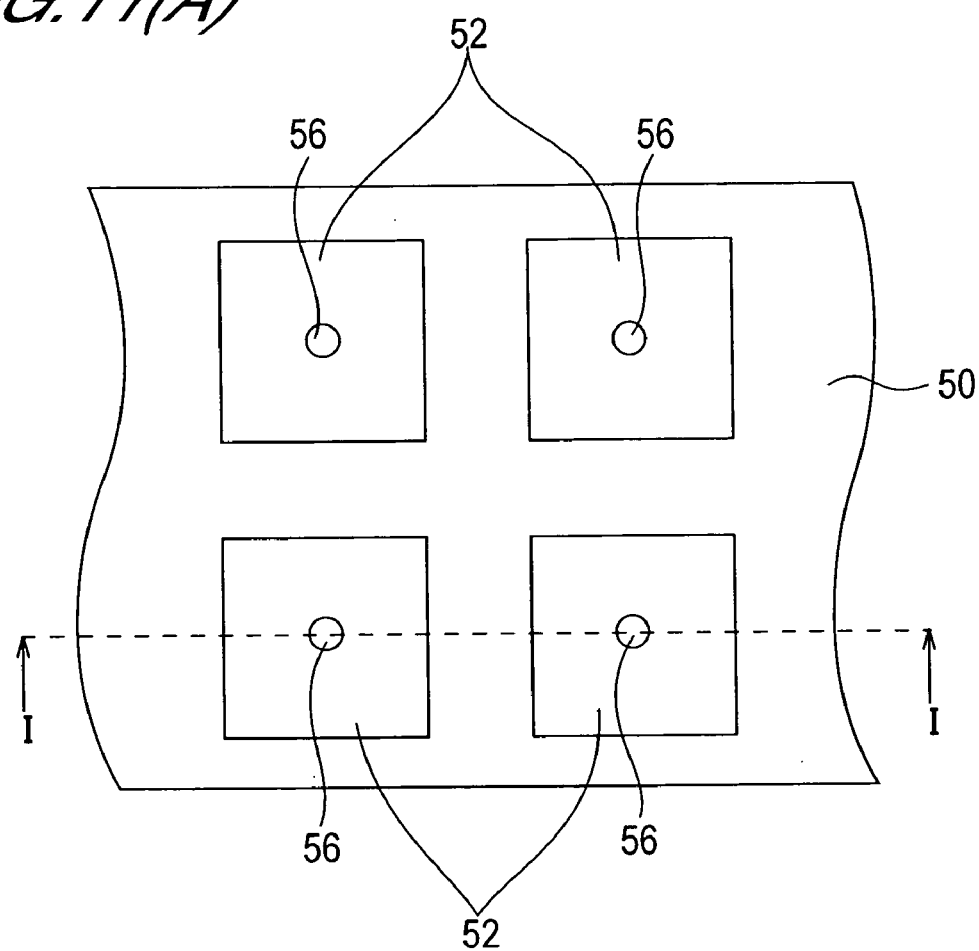
FIG. 11 is a schematic plan view and a sectional view (1) of a jig which is preferably used in a manufacturing method for the semiconductor device of this invention.
Figure 11B:
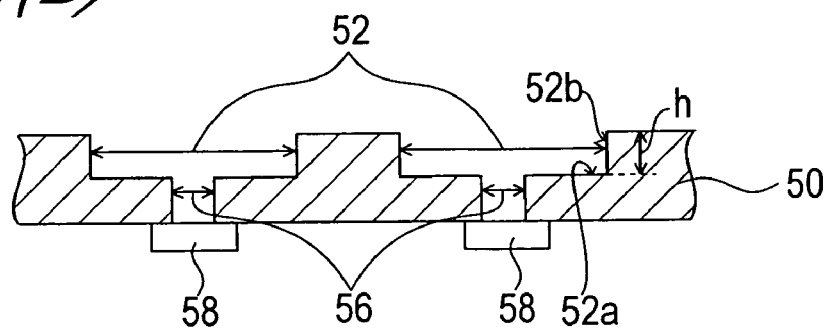

FIG. 11(A) is a partial schematic plan view illustrating the constitution of a preferred jig to be applied to the second manufacturing method of the semiconductor device of this invention, and FIG. 11(B) is a schematic sectional view showing a cross section severed along the I—I broken line in FIG. 11(A).

Figure 12:
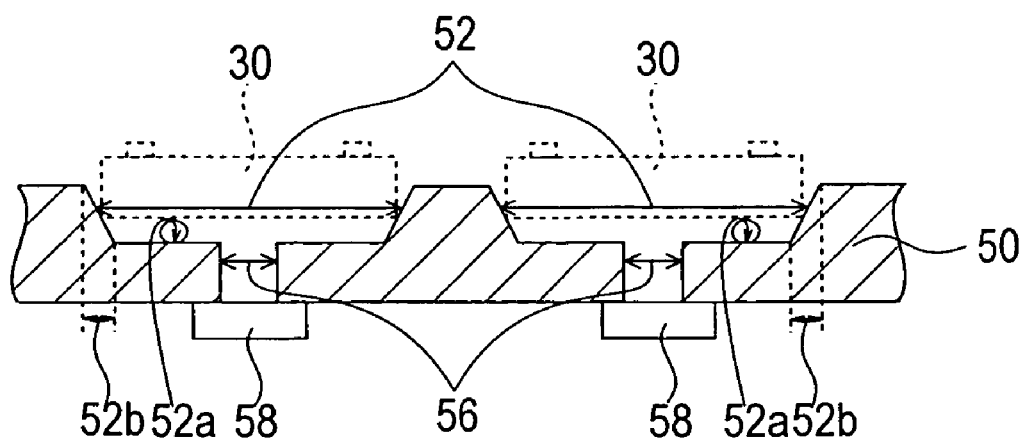
FIG. 12 is a schematic sectional view (2) of the jig which is preferably used in a manufacturing method for the semiconductor device of this invention.

FIG. 12 is a schematic sectional view for illustrating the constitution of a modified example of the jig in FIG. 11 which is preferably applied to the second manufacturing method of this invention. Note that in FIG. 12, the plan view seen from above is similar to FIG. 11(A), and hence illustration and detailed description thereof have been omitted.

The jig 50 is a tool used in the manufacturing process for supporting or aligning constitutional elements. In this constitutional example, the jig 50 is a pedestal comprising a plurality of concave portions 52 at equal intervals and in a lattice formation. The interval between adjacent concave portions 52 is preferably determined in consideration of the surface area of the extension portion required for the semiconductor device 10 to be manufactured, or in other words the disposal positions, disposal pitch, disposal number, and so on of the external electrodes.

In this example, the concave portions 52 of the jig 50 are set as depressions in rectangular parallelepiped form. There are no particular limitations on this form, however, as long as semiconductor chips 30 having various forms can be held by the concave portions 52 with stability and do not interfere with the implementation of subsequent processes.

A depth h of each concave portion 52 and the surface area of a bottom surface portion 52a should be set sufficiently to allow the semiconductor chips 30 to be held by and fixed on the jig 50 with stability and to allow the implementation of subsequent processes.

When the first and second main surfaces 36 and 38 of the semiconductor chip 30 are rectangular parallelepipeds with identical form and size, for example, the surface area of the bottom surface portion 52a of the concave portion 52 is preferably set to be equal to the surface area of at least the second main surface 38, and such that side wall portions 52b of the concave portion 52 are perpendicular to the bottom surface portion 52a.

Alternatively, as shown in FIG. 12, the surface area of the bottom surface portion 52a of the concave portion 52 (including the surface area of a through hole 56 to be described hereinafter) may be set smaller than the surface area of the second main surface 38 and such that the side wall portions 52b of the concave portion 52 are inclined, whereby the distal end thereof becomes gradually thinner toward the interior of the concave portion 52.

In this case, as shown by the dotted line in FIG. 12, the semiconductor chip 30 is held by the jig 50 within the inclined region of the side wall portions 52b such that the jig 50 contacts a region in the vicinity of the edges of the semiconductor chip 30 on the second main surface 38 side, or in other words the periphery of and the vicinity of the periphery of the second main surface 38. By means of this constitution, the region of the semiconductor chip 30 which contacts the jig 50 is minimized, and thus the step of removing the semiconductor chip 30 from the jig 50 becomes extremely easy.

Further, since the semiconductor chip 30 may be supported within the range of the incline of the side wall portions 52b, a plurality of semiconductor chips 30 having various different sizes may be used with one type of jig.

The jig 50 is preferably constituted by a material such as a metal or ceramic which has a low adhesiveness in respect of the semiconductor chip 30 or an appropriate material coated with Teflon (registered trademark) or the like which has a low adhesiveness in respect thereof. In so doing, the step of peeling an unfinished constitutional body including the semiconductor device away from the jig 50 may be implemented easily.

A through hole 56 is preferably formed in the concave portion 52 of the jig 50. A suction and exhaust system 58 for suction-holding the semiconductor chip 30 in the concave portion 52 is preferably connected to the through hole 56.

The suction and exhaust system 58 may be constituted by a well-known evacuation system comprising a vacuum pump, piping, and so on, for example.

Next, the second manufacturing method using the jig 50 for the semiconductor device of this invention will be described with reference to FIGS. 13(A) through 14(C).

In FIGS. 13 and 14, the plan views seen from above are similar to those of the first manufacturing method and hence illustration and description thereof have been omitted. The second manufacturing method will therefore be described with reference to the schematic sectional views.

First, the jig 50 is prepared as described above with reference to FIGS. 11 and 12.

Figure 13A:
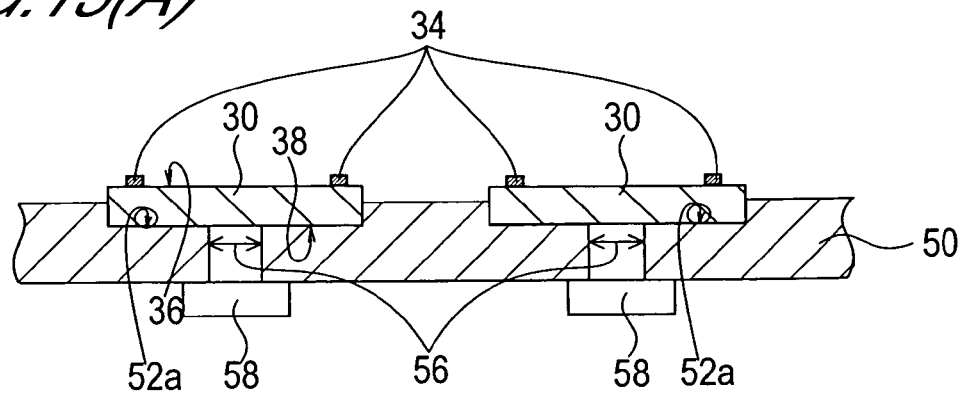
FIG. 13 is a schematic sectional view (1) for illustrating a second manufacturing method for the semiconductor device of this invention.

Then, as shown in FIG. 13(A), the semiconductor chip 30 is set inside the concave portion 52 such that the second main surface 38 of the semiconductor chip 30 faces the bottom surface 52a of the concave portion 52 of the jig 50. If the surface area of the bottom surface portion 52a of the concave portion 52 is set smaller than the surface area of the second main surface 38 and the side wall portions 52b defining the periphery of the concave portion 52 are inclined toward the interior of the concave portion 52 as shown in FIG. 12, the semiconductor chip 30 is provided on the jig 50 within the inclined region of the side wall portions 52b such that the jig 50 contacts the region in the vicinity of the edges of the semiconductor chip 30 on the second main surface 38 side, or in other words the periphery of and the vicinity of the periphery of the second main surface 38.

If the through hole 56 and the suction and exhaust system 58 which is connected thereto are provided in the bottom surface portion 52a of the concave portion 52 in the jig 50 as described above, air is preferably evacuated thereby from the contact surface (gap) between the second main surface 38 of the semiconductor chip 30 and the bottom surface portion 52a of the concave portion 52 such that the semiconductor chip 30 is suction-held on the jig 50.

The degree of evacuation required for suction-holding the semiconductor chip 30 on the jig 50 should be sufficient to enable the semiconductor chip 30 to be held with stability.

Figure 13B:
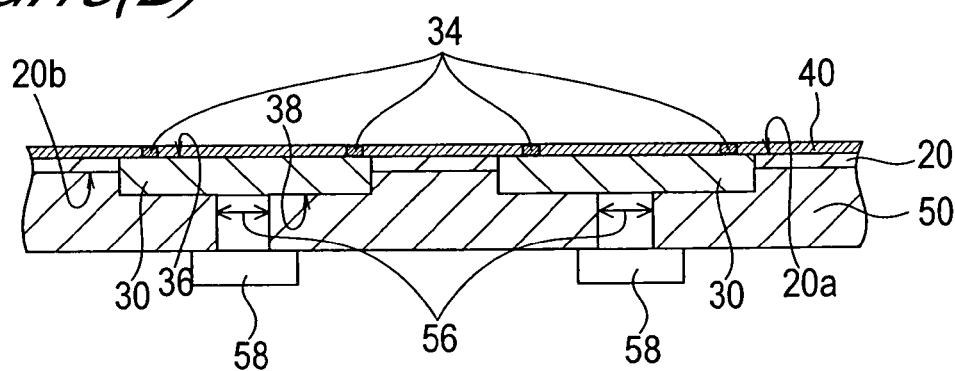

Next, as shown in FIG. 13(B), the extension portion 20 is formed on the surfaces of the semiconductor chip 30 other than the first and second main surfaces 36 and 38, or in other words in contact with and surrounding the side surfaces 37 of the semiconductor chip 30.

The extension portion 20 is formed such that the level of the first surface 20a thereof is substantially equal to the level of the first main surface 36 of the semiconductor chip 30.

Formation of the extension portion 20 is performed by making a selection from the methods and materials described above. If the side wall portions 52b of the jig 50 are inclined as described above, a slight gap (space) may occur between the jig 50 and the lower portion of the side surface portion of the semiconductor chip 30. Although no further processing is required for this gap if the gap is within a range which does not interfere with subsequent processes, in particular formation of the wiring patterns, the extension portion 20 may be formed as desired such that the gap does not occur.

Next, the insulating film 40 is formed on the surface of the extension portion 20 and first main surface 36 of the semiconductor chip 30 which are formed on the jig 50 such that the electrode pads 34 provided on the semiconductor chip 30 are exposed.

Figure 13C:
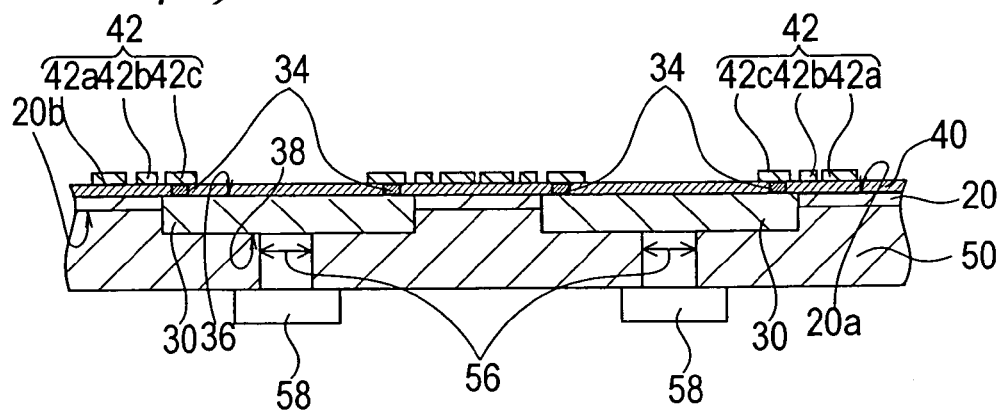

Next, as shown in FIG. 13(C), the plurality of wiring patterns 42 is formed on the surface of the insulating film 40 so as to be electrically connected to the top surface of the respective electrode pads 34. In this case, similarly to the first manufacturing method, the wiring patterns 42 and electrode pads 34 are connected in a one-on-one relationship of one wiring pattern to one electrode pad.

Figure 14A:
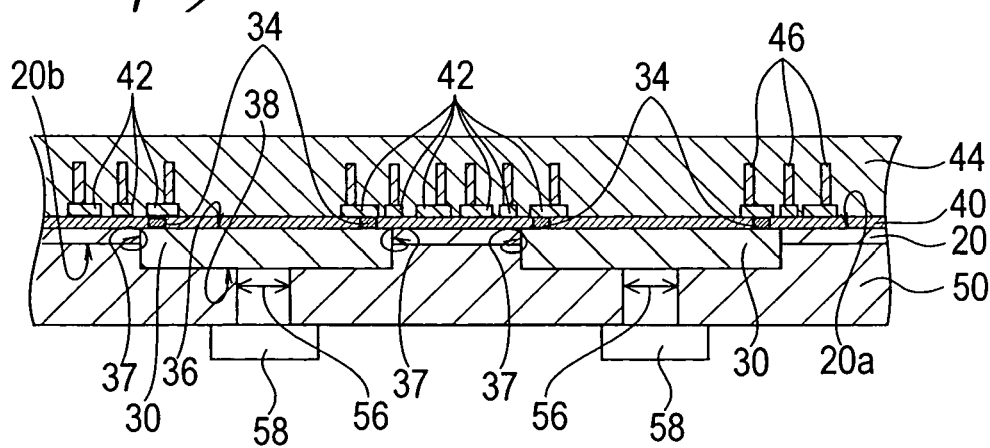
FIG. 14 is a schematic sectional view (2) proceeding from FIG. 13 for illustrating the second manufacturing method for the semiconductor device of this invention.

Then, as shown in FIG. 14(A), one electrode post 46 is formed on and connected to each wiring pattern 42. The electrode posts 46 are provided in the extended region 21 on the upper side of (directly above) the extension portion 20 and in the region on the upper side of (directly above) the semiconductor chip 30 in the vicinity of the extended region 21.

Next, the sealing portion 44 is formed covering the surface of the insulating film 40 on which the wiring patterns 42 and electrode posts 46 are formed.

Figure 14B:
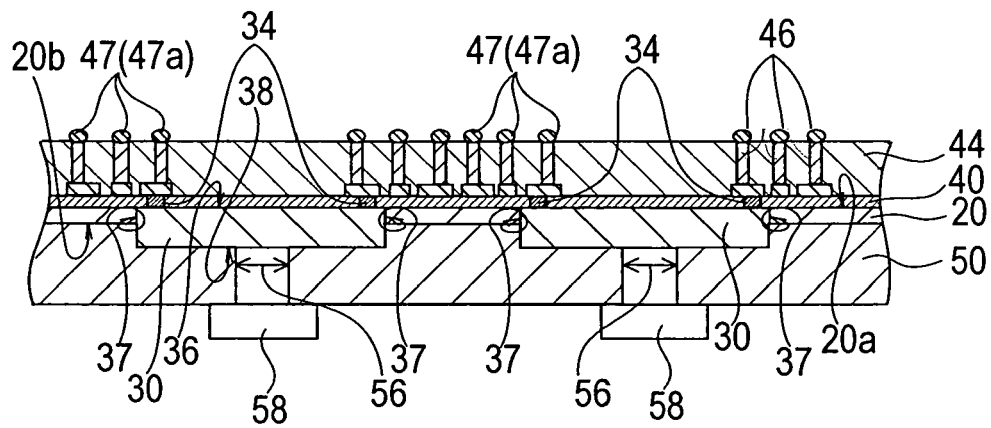

Then, as shown in FIG. 14(B), the sealing portion 44 is trimmed from the surface side thereof such that the top surface of the electrode posts 46 is exposed.

The solder balls 47a serving as the external terminals 47 are then formed on the exposed top surface of the electrode posts 46.

Figure 14C:
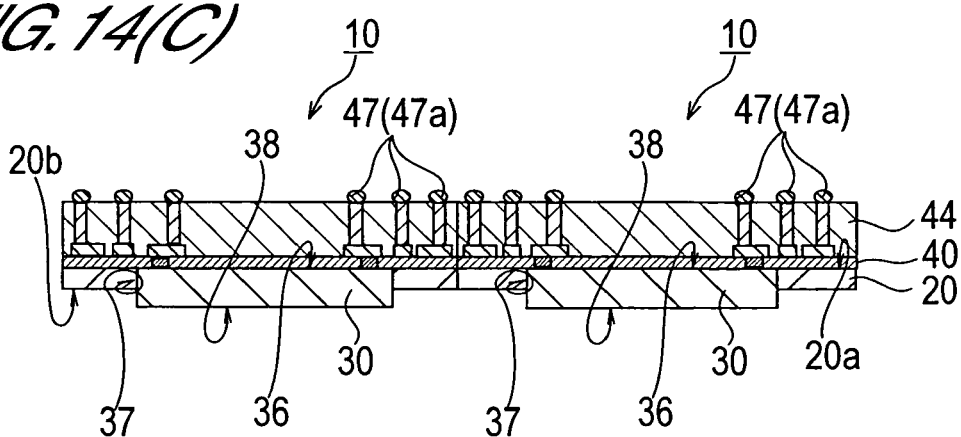

Then, as shown in FIG. 14(C), the jig 50 is peeled away from the second surface 20b of the extension portion 20 and the second main surface 38 following release of the vacuum if vacuum suction means are employed.

The plurality of adjacent semiconductor chips 30 are then severed to form individual semiconductor devices 10 comprising the semiconductor chip 30.

By means of such a process, a semiconductor device is manufactured having a substantially identical constitution to the semiconductor device manufactured according to the first manufacturing method described above.

Note that in the semiconductor device manufactured according to the second manufacturing method, step are produced by the concave portions 52 of the jig 50 on the bottom surface side of the semiconductor device, or more specifically between the second surface 20b of the extension portion 20 and the second main surface 38 of the semiconductor chip 30. If not desired, however, no further processing is necessary.

According to the second manufacturing method, a single jig can be used repeatedly. Since there is no need to use a lower base as in the first manufacturing method, the number of members required in the manufacturing process can be reduced. As a result, a reduction in manufacturing costs can be expected. Further, when the semiconductor chip is suction-held on the jig by a suction and exhaust system via a through hole, holding the semiconductor chip on the jig and removing the semiconductor device therefrom can be performed easily and speedily such that an increase in the throughput of the manufactured semiconductor devices can be expected.

In all embodiments of this invention, the electrode posts 46 are preferably formed from a conductive material. This material is preferably copper. A thin oxidation layer is preferably formed on the surface of the electrode posts 46 at this time. In so doing, the adhesive property between the electrode posts 46 and the sealing portion 44 is improved, thereby improving resistance to moisture.

In all embodiments of this invention the solder balls 47a are formed on the electrode posts 46 as the external terminals 47. A so-called BGA (Ball Grid Array) has been described, but this invention is not limited thereto. For example, a so-called LGA (Land Grid Array) may be formed by applying and reflow soldering solder paste onto the exposed electrode posts 46 or implementing Ni/Au processing by means of electroless plating.

In all embodiments of this invention, the sealing portion may be formed not only in a so-called saw-cut form, but may also be formed not matching the profile of the lower base and/or the extension portion as long as the extent of this misalignment is within a range which does not impair the object of this invention.

The semiconductor device 10 according to the first embodiment described above may be constituted as a stacked body of a plurality of semiconductor devices 10. In this case, for example, through holes may be formed in the extension portion using a well-known method to thereby form stacking terminals.

What is claimed is:

1. A semiconductor device comprising:
   a semiconductor chip having a first main surface on which a plurality of electrode pads are provided, a second main surface which opposes said first main surface, and a plurality of side surfaces between said first main surface and said second main surface;
   an extension portion which has a first surface and a second surface opposing said first surface, and which is formed in contact with said side surfaces of said semiconductor chip to surround said semiconductor chip and such that said first surface is at a substantially equal level to the level of said first main surface;
   an insulating film which is formed on said first surface and said first main surface such that a part of each of said plurality of electrode pads is exposed;
   a plurality of wiring patterns electrically connected to each of said electrode pads, respectively and extended from said electrode pads to the upper side of the first surface of said extension portion;
   a sealing portion which is formed on said wiring patterns and said insulating film such that a part of each of said wiring patterns is exposed; and
   a plurality of external terminals provided over said wiring patterns in a region including the upper side of said extension portion; and
   wherein a portions of said wiring patterns on a boundary and vicinity thereof between said semiconductor chip and the extension portion are formed wider or more thickly than other portions of said wiring patterns.

2. The semiconductor device according to claim 1, further comprising a plurality of electrode posts formed between said wiring patterns and said external terminals, wherein said sealing portion is formed such that the top surface of said electrode posts is exposed.

3. The semiconductor device according to claim 1, further comprising a lower base for supporting the second surface of said extension portion and the second main surface of said semiconductor chip.

4. The semiconductor chip according to claim 1, wherein said electrode posts are formed from a conductive material.

5. The semiconductor device according to claim 1, wherein said extension portion is formed from a material having greater molding shrinkage than the molding shrinkage of said sealing portion.

6. The semiconductor device according to claim 4, wherein said extension portion is formed from a liquid resin having a coefficient of linear expansion, within a lower temperature range than a glass transition temperature, of less than $1.5 \times 10^{-5}/°$ C. and a modulus of elasticity within a range of 7.8 to 22 GPa.

7. The semiconductor chip according to claim 1, wherein the external terminals are formed as solder balls.

8. The semiconductor chip according to claim 1, wherein the external terminals are formed as lands.

* * * * *